United States Patent [19]

Yu

[11] Patent Number: 4,866,304

[45] Date of Patent: Sep. 12, 1989

[54] BICMOS NAND GATE

[75] Inventor: Ruey J. Yu, Austin, Tex.

[73] Assignee: Motorola, Inc., Schaumburg, Ill.

[21] Appl. No.: 197,489

[22] Filed: May 23, 1988

[51] Int. Cl.$^4$ .................. H03K 17/16; H03K 19/02; H03K 19/094

[52] U.S. Cl. .................. 307/446; 307/443; 307/448; 307/451; 307/570

[58] Field of Search .............. 307/443, 446, 448, 451, 307/570

[56] References Cited

U.S. PATENT DOCUMENTS 4,694,202  9/1987  Iwamura et al. ............... 307/446
4,730,132  3/1988  Watanabe et al. ............... 307/448

Primary Examiner—John Zazworsky
Assistant Examiner—Margaret R. Wambach
Attorney, Agent, or Firm—James L. Clingen

[57] ABSTRACT

A BICMOS NAND gate has P channel transistors, N channel transistors, and NPN transistors. The NPN transistors and the P channel transistors combine to provide logic high drive which avoids having the comparatively slow P channel transistors tied together. The P channel transistors are combined with NPN transistors to avoid the accumulation of capacitance that must be driven by a P channel transistor as the number of inputs increases. This avoids the typical problem of having the P channel transistors having to drive more capacitance as the number of inputs increases.

5 Claims, 1 Drawing Sheet

BICMOS NAND GATE

FIELD OF THE INVENTION

The invention relates to NAND gates, and more particularly, to NAND gates which are implemented using BICMOS.

BACKGROUND OF THE INVENTION

There have been found to be advantages to combining CMOS and bipolar circuits on the same integrated circuit. Such integrated circuits are commonly known as BICMOS. The advantage of CMOS is generally recognized as providing low power consumption, particularly for the case where the circuit has completed switching. Bipolar has the advantage of speed and power. Typically, in implementing a function, the CMOS performs the logic and the bipolar provides the drive. The actual drive circuit may include some MOS transistors in addition to the bipolar transistors. In the case of a NAND gate, for example, the typical implementation is to have the input signals received by a conventional CMOS configuration. The CMOS configuration performs the logic and provides and output which is then driven by a circuit which includes bipolar transistors. This type of approach, for example, is shown in U.S. Pat. Nos. 4,733,110 and 4,752,982, both Hara et al. U.S. Pat. Nos. 4,716,310, Tanizawa et al, 4,701,642, Pricer, and 4,694,203, Uragami et al, are other examples of CMOS logic followed by drivers which include bipolar transistors.

Another BICMOS circuit that has been found to be advantageous is a P channel transistor and an NPN transistor in which the drain of the P channel transistor drives into the base of the NPN transistor. This results in particularly good performance. This has been described in U.S. Pat. No. 4,694,202, Iwamura et al. One way this has been implemented is as an inverter in which the emitter provides the output of the inverter. In such a case a resistor is used in conjunction with the P channel transistor and the NPN transistor. This resistor is connected to the base of the bipolar transistor and the output of the inverter. An N channel transistor is connected to the output of the inverter to act as the pull-down device of the inverter. It is normal for an N channel transistor to act as a pull-down device. This has the effect of placing the resistor in series between the P channel transistor and the N channel pull-down transistor.

This P channel and NPN combination was also used to make a NAND gates. Two configurations of NAND gates using this combination were disclosed in the '202 patent. One was shown in FIG. 14 and the other in FIG. 15. The resulting configurations had the P channel transistors all connected to the same node which is consistent with common approach of using the CMOS for the logic function and driving the output of the CMOS circuit with bipolar devices. This has a deleterious effect on the speed. The intent of the combination was to make the circuit operate faster. The creation of the NAND gate function created a high capacitance node which was driven only by P channel transistors, the transistor type of those present which is least able to quickly drive a node. The increased capacitance of the node driven exclusively by P channel transistors is increased even more as the number of inputs is increased. The number of inputs can be quite substantial. The desired use of the NAND gate might be, for example, a decoding function in a memory where the inputs could be desirably quite large.

SUMMARY OF THE INVENTION

Accordingly, it is an object of the present invention to provide an improved BICMOS NAND gate.

It is another object of the present invention to provide a BICMOS NAND gate with improved speed.

In carrying out these and other objects of the invention, there is provided, in one form, a NAND gate having a first P channel transistor, a second P channel transistor, a first NPN transistor, a second NPN transistor, a first resistor, a second resistor, and a pull-down circuit. The first P channel transistor has a first current coupled to a first power supply terminal, a control electrode for receiving a first input signal, and a second current electrode. The first NPN transistor has a first current electrode coupled to the first power supply terminal, a control electrode coupled to the second current electrode of the first P channel transistor, and a second current electrode coupled to an output node. An output signal of the NAND gate is provided on the output node. The first resistor has a first terminal coupled to the control electrode of the first NPN transistor and a second terminal coupled to the second current electrode of the first NPN transistor. The second P channel transistor has a first current coupled to the first power supply terminal, a control electrode for receiving a second input signal, and a second current electrode. The second NPN transistor has a first current electrode coupled to the first power supply terminal, a control electrode coupled to the second current electrode of the second P channel transistor, and a second current electrode coupled to the output node. The second resistor has a first terminal coupled to the control electrode of the second NPN transistor and a second terminal coupled to the second current electrode of the second NPN transistor. The pull-down circuit provides a current path between the output node and the second power supply terminal only if the first and second input signals are a logic high and blocks said current path if one or a more of the first and second input signals are a logic low.

DETAILED DESCRIPTION OF THE INVENTION

Figure 1:
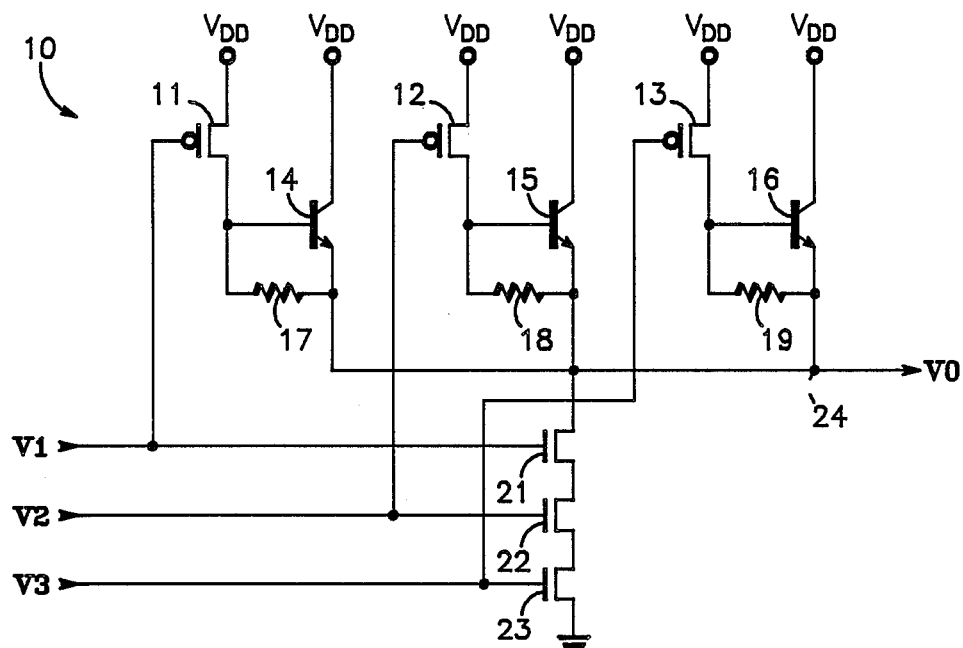
FIG. 1 is a circuit diagram of a BICMOS NAND gate according to a preferred embodiment of the invention.

Shown in FIG. 1 is a NAND gate 10 comprised of a P channel transistor 11, a P channel transistor 12, a P channel transistor 13, an NPN transistor 14, an NPN transistor 15, an NPN transistor 16, a resistor 17, a resistor 18, a resistor 19, an N channel transistor 21, an N channel transistor 22, and an N channel transistor 23. NAND gate 10 is a three-input NAND gate which receives input signals V1, V2, and V3 and provides output signal VO at logic states according to conventional NAND gate logic. The connections of the components which comprise NAND gate 10 will now be described.

P channel transistor 11 has a source connected to a positive power supply terminal VDD for receiving a positive power supply voltage of, for example, 5 volts, a gate for receiving input signal V1, and a drain. Transistor 14 has a collector connected to VDD, a base connected to the drain of transistor 11, and an emitter connected to a node 24. Output signal VO is provided from node 24. Resistor 17 has a first terminal connected to the base of transistor 14, and a second terminal connected to the emitter of transistor 14. Transistor 12 has a source connected to VDD, a gate for receiving signal V2, and a drain. Transistor 15 has a base connected to the drain of transistor 12, a collector connected to VDD, and an emitter connected to node 24. Resistor 18 has a first terminal connected to the base of transistor 15, and a second terminal connected to the emitter of transistor 15. Transistor 13 has a gate for receiving input signal V3, a source connected to VDD, and a drain. Transistor 16 has a base connected to the drain of transistor 13, a collector connected to VDD, and an emitter connected to node 24. Resistor 19 has a first terminal connected to the base of transistor 16, and a second terminal connected to the emitter of transistor 16. Transistor 21 has a drain connected to node 24, a gate for receiving signal V1, and a source. Transistor 22 has a drain connected to the source of transistor 21, a gate for receiving signal V2, and a source. Transistor 23 has a drain connected to the source of transistor 22, a gate for receiving signal V3, and a source connected to ground. Transistors 21-23 are connected in series between ground and node 24. The order in which these transistors are connected in series is not significant.

If all of signals V1-V3 are a logic high, all of transistors 21-23 are conductive so that node 24 is pulled to ground, or near ground, potential and signal VO is provided as a logic low. Transistors 11-13 are nonconductive so that there is no current supplied to the bases of transistors 14-16 so that transistors 14-16 are nonconductive. There is no current path between VDD and ground in NAND gate 10. If one or more of signals V1-V3 are a logic low, node 24 is driven to the voltage at or near VDD. For example if signal V1 is a logic low, transistor 21 will be non-conductive and transistor 11 will be conductive. Transistor 11 being conductive will cause current to be driven into the base of transistor 14 which will cause transistor 14 to very rapidly raise the voltage on node 24 to at or near VDD minus the base-emitter drop Vbe of an NPN transistor which is approximately 0.7 volt. Current through resistor 17 will cause the voltage on node 24 to be raised all the way to at or near VDD. The speed advantage of the drain of a P channel transistor driving into the base of an NPN transistor for providing a logic high is known and discussed in detail in U.S. Pat. No. 4,694,202, Iwamura et al. Transistor 21, which also receives signal V1, is non-conductive in response to signal V1 being a logic low. With transistor 21 being nonconductive, NAND gate 10 thus has no current path to ground. There is then no static current flowing between VDD and ground in NAND gate 10. Of course subsequent circuitry, chosen by a user of NAND gate 10 to be driven by signal VO, may have a current path to ground.

Resistor 17 not only provides the full logic high level but is also important in causing transistor 14 to become quickly non-conductive in response to signal V1 switching to a logic high. There is capacitance associated with the base of transistor 14 which will hold charge. This capacitance is then discharged through resistor 17 instead of being discharged as base current through transistor 14 where it will be multiplied by the beta of transistor 14 and supplied onto node 24 as emitter current. In the prior art logic circuits, the P channel transistors which have been used as the logic high drivers have had their drains connected together. The P channel transistors have a function which is uniquely desirable but are inherently slower than N channel or NPN transistors. Thus the logic high drive is typically slower than the logic low pull-down. By tying the P channels together, the slowest element was further slowed. This was the natural result of the common approach of BICMOS logic which was to perform the logic function with CMOS circuits which did not have bipolar transistors and have the output drive circuitry include bipolar transistors. NAND gate 10 avoids the logic high slow down caused by the prior art's tying the P channel transistors together. Thus transistor 12 only has to drive into the base of transistor 15 and resistor 18. Similarly, transistor 13 has to drive only into the base of transistor 16 and resistor 19. This is even more important as the number of inputs increases, because the capacitance that must be driven by tied-together P channels would increase even more.

The series N channel transistors 21-23 perform the function of pulling node 24 to ground in response to all of signals V1-V3 being a logic high and blocking a path to ground in response to one or more of signals V1-V3 being a logic low. This function may be performed in some other manner than just N channel transistors in series although N channel transistors are very effective in performing this function. In NAND gate 10 transistors 11-13 can be quite small and thus provide minimal capacitive loading to signals V1-V3. For a given loading on signals V1-V3, the N channel transistors can be increased in size and the P channel transistors reduced from the typical CMOS NAND gate sizing. This would allow more inputs to the NAND gate because more N channel transistors could be placed in series.

Figure 2:
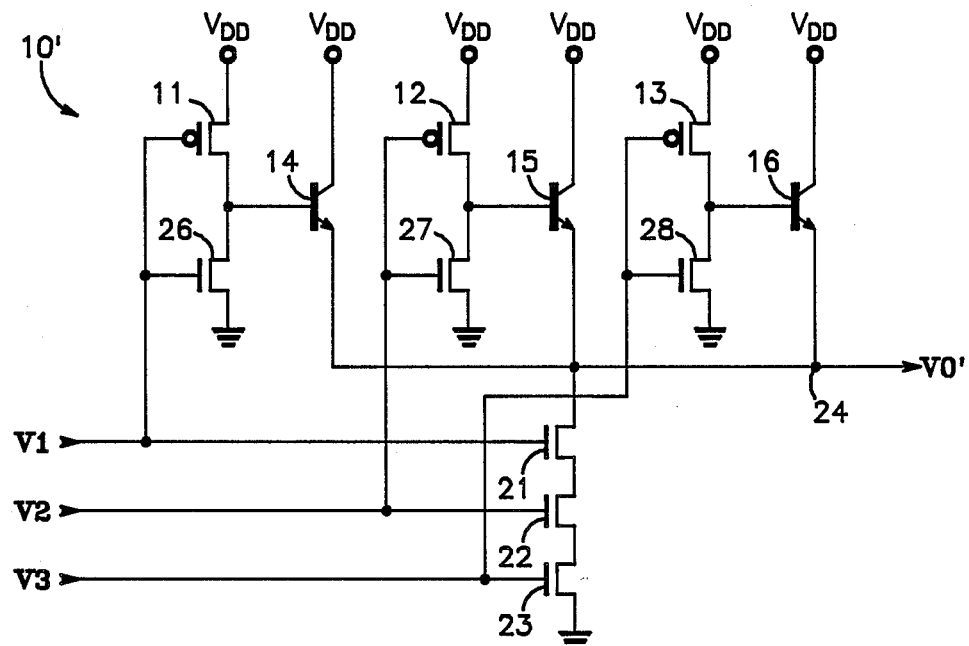
FIG. 2 is a circuit diagram of a BICMOS NAND gate according to a second embodiment of the invention.

Shown in FIG. 2 is a NAND gate 10' which is nearly the same as NAND gate 10 in FIG. 1. NAND gate 10' has N channel transistors 26, 27, and 28 instead of resistors 17-18. The elements which are the same have retained the same numbers. Transistor 26 has a drain connected to the base of transistor 14, a gate for receiving signal V1, and a source connected to ground. Transistor 27 has a drain connected to the base of transistor 15, a gate for receiving signal V2, and a source connected to ground. Transistor 28 has a drain connected to the base of transistor 16, a gate for receiving signal V3, and a source connected to ground. Transistors 26-28 provide a faster discharge of the bases of transistors 14-16, respectively, than do resistors 17-19. Resistors 17-19, however, have other advantages. Resistors 17-19 provide a current path between node 24 and the drains of transistors 11-13 so that signal VO is a full logic high. NAND gate 10', provides its output signal VO' at one Vbe below VDD instead of at or near VDD. NAND gate 10' can be providing a logic high while one or more of transistors 14-16 are nonconductive. In the case of, for example, signal V1 being a logic high and signal V2 being a logic low, transistor 26 is conductive and holds the base of transistor 14 to ground potential. Transistor 15 on the other hand is supplying signal VO' at a logic high of VDD minus Vbe. This causes the base-emitter junction of transistor 14 to be reverse biased by VDD minus Vbe. A typical reverse bias breakdown of a base-emitter junction is around 5 volts. Thus, especially, for higher that nominal voltage of VDD, transistors 14–16 could have their base-emitter junctions breakdown. Thus, under current technology, NAND gate 10 of FIG. 1 is the preferred choice. Both NAND gate 10 and 10' offer the advantage of not tying the P channel transistors together.

While in the invention has been described in specific embodiments, it will be apparent to those skilled in the art that the disclosed invention may be modified in numerous ways and may assume many embodiment other than those specifically set out and described above. Accordingly, it is intended by the appended claims to cover all modifications of the invention which fall within the true spirit and scope of the invention.

I claim:

1. A NAND gate comprising:
   a first P channel transistor having a first current coupled to a first power supply terminal, a control electrode for receiving a first input signal, and a second current electrode;
   a first NPN transistor having a first current electrode coupled to the first power supply terminal, a control electrode coupled to the second current electrode of the first P channel transistor, and a second current electrode coupled to an output node, an output signal of the NAND gate being provided on the output node;
   a first resistor having a first terminal coupled to the control electrode of the first NPN transistor and a second terminal coupled to the second current electrode of the first NPN transistor;
   a second P channel transistor having a first current electrode coupled to the first power supply terminal, a control electrode for receiving a second input signal, and a second current electrode;
   a second NPN transistor having a first current electrode coupled to the first power supply terminal, a control electrode coupled to the second current electrode of the second P channel transistor, and a second current electrode coupled to the output node;
   a second resistor having a first terminal coupled to the control electrode of the second NPN transistor and a second terminal coupled to the second current electrode of the second NPN transistor;
   a third P channel transistor having a first current coupled to the first power supply terminal, a control electrode for receiving a third input signal, and a second current electrode;
   a third NPN transistor having a first current electrode coupled to the first power supply terminal, a control electrode coupled to the second current electrode of the third P channel transistor, and a second current electrode coupled to the output node;
   a third resistor having a first terminal coupled to the control electrode of the third NPN transistor and a second terminal coupled to the second current electrode of the third NPN transistor; and
   pull-down means, coupled between the output node and a second power supply terminal, for providing a current path between the output node and the second power supply terminal only if the first, second, and third input signals are a logic high and blocking said current path if one or a more of the first, second, and third input signals are a logic low;
   said pull-down means comprising first, second and third N channel transistors connected in series between the output node and the second power supply terminal, said first N channel transistor having a control electrode for receiving the first input signal, said second N channel transistor having a control electrode for receiving the second input signal, and said third N channel resistor having a control electrode for receiving the third input signal.

2. A NAND gate comprising:
   a first P channel transistor having a first current coupled to a first power supply terminal, a control electrode for receiving a first input signal, and a second current electrode;
   a first NPN transistor having a first current electrode coupled to the first power supply terminal, a control electrode coupled to the second current electrode of the first P channel transistor, and a second current electrode coupled to an output node, an output signal of the NAND gate being provided on the output node;
   a first resistor having a first terminal coupled to the control electrode of the first NPN transistor and a second terminal coupled to the second current electrode of the first NPN transistor;
   a second P channel transistor having a first current electrode coupled to the first power supply terminal, a control electrode for receiving a second input signal, and a second current electrode;
   a second NPN transistor having a first current electrode coupled to the first power supply terminal, a control electrode coupled to the second current electrode of the second P channel transistor, and a second current electrode coupled to the output node;
   a second resistor having a first terminal coupled to the control electrode of the second NPN transistor and a second terminal coupled to the second current electrode of the second NPN transistor; and
   pull-down means, coupled between the output node and a second power supply terminal, for providing a current path between the output node and the second power supply terminal only if the first and second input signals are a logic high and blocking said current path if one or a more of the first and second, input signals are a logic low;
   said pull-down means comprising first and second N channel transistors connected in series between the output node and the second power supply terminal, said first N channel transistor having a control electrode for receiving the first input signal and said second N channel transistor having a control electrode for receiving the second input signal.

3. A NAND gate comprising:
   a first P channel transistor having a first current coupled to a first power supply terminal, a control electrode for receiving a first input signal, and a second current electrode;
   a first NPN transistor having a first current electrode coupled to the first power supply terminal, a control electrode coupled to the second current electrode of the first P channel transistor, and a second current electrode coupled to an output node, an output signal of the NAND gate being provided on the output node;
   a first N channel transistor having a control electrode for receiving the first input signal, a first current electrode coupled to the base of the first NPN transistor, and a second current electrode coupled to a second power supply terminal;

a second P channel transistor having a first current electrode coupled to the first power supply terminal, a control electrode for receiving a second input signal, and a second current electrode;

a second NPN transistor having a first current electrode coupled to the first power supply terminal, a control electrode coupled to the second current electrode of the second P channel transistor, and a second current electrode coupled to the output node;

a second N channel transistor having a control electrode for receiving the second input signal, a first current electrode coupled to the base of the second NPN transistor, and a second current electrode coupled to the second power supply terminal;

a third P channel transistor having a first current coupled to the first power supply terminal, a control electrode for receiving a third input signal, and a second current electrode;

a third NPN transistor having a first current electrode coupled to the first power supply terminal, a control electrode coupled to the second current electrode of the third P channel transistor, and a second current electrode coupled to the output node;

a third N channel transistor having a control electrode for receiving the third input signal, a first current electrode coupled to the base of the third NPN transistor, and a second current electrode coupled to the second power supply terminal; and pull-down means, coupled between the output node and a second power supply terminal, for providing a current path between the output node and the second power supply terminal only if the first, second, and third input signals are a logic high and blocking said current path if one or a more of the first, second, and third input signals are a logic low;

said pull-down means comprising fourth, fifth, and sixth N channel transistors connected in series between the output node and the second power supply terminal, said forth N channel transistor having a control electrode for receiving the first input signal, said fifth N channel transistor having a control electrode for receiving the second input signal, and said sixth N channel transistor having a control electrode for receiving the third input signal.

4. A NAND gate comprising:

a first P channel transistor having a first current coupled to a first power supply terminal, a control electrode for receiving a first input signal, and a second current electrode;

a first NPN transistor having a first current electrode coupled to the first power supply terminal, a control electrode coupled to the second current electrode of the first P channel transistor, and a second current electrode coupled to an output node, an output signal of the NAND gate being provided on the output node;

a first N channel resistor having a control electrode for receiving the first input signal, a first current electrode coupled to the base of the first NPN transistor, and a second current electrode coupled to a second power supply terminal;

a second P channel transistor having a first current electrode coupled to the first power supply terminal, a control electrode or receiving a second input signal, and a second current electrode;

a second NPN transistor having a first current electrode coupled to the first power supply terminal, a control electrode coupled to the second current electrode of the second P channel transistor, and a second current electrode coupled to the output node;

a second N channel transistor having a control electrode for receiving the second input signal, a first current electrode coupled to the base of the second NPN transistor, and a second current electrode coupled to the second power supply terminal; and pull-down means, coupled between the output node and a second power supply terminal, for providing a current path between the output node and the second power supply terminal only if the first and second input signals are a logic high and blocking said current path if one or a more of the first and second input signals are a logic low;

said pull-down means comprising third and fourth N channel transistors connected in series between the output node and the second power supply terminal, said third N channel transistor having a control electrode for receiving the first input signal and said fourth N channel transistor having a control electrode for receiving the second input signal.

5. A NAND gate, comprising:

a first P channel transistor having a first current coupled to a first power supply terminal, a control electrode for receiving a first input signal, and a second current electrode;

a first NPN transistor having a first current electrode coupled to the first power supply terminal, a control electrode coupled to the second current electrode of the first P channel transistor, and a second current electrode coupled to an output node, an output signal of the NAND gate being provided on the output node;

a first resistor having a first terminal coupled to the control electrode of the first NPN transistor and a second terminal coupled to the second current electrode of the first NPN transistor;

a second P channel transistor having a first current coupled to the first power supply terminal, a control electrode for receiving a second input signal, and a second current electrode;

a second NPN transistor having a first current electrode coupled to th first power supply terminal, a control electrode coupled to the second current electrode of the second P channel transistor, and a second current electrode coupled to the output node;

a second resistor having a first terminal coupled to the control electrode of the second NPN transistor and a second terminal coupled to the second current electrode of the second NPN transistor; and a first P channel transistor having a first current coupled to the first power supply terminal, a control electrode for receiving a third input signal, and a second current electrode;

a third NPN transistor having a first current electrode coupled to the first power supply terminal, a control electrode coupled to the second current electrode of the third P channel transistor, and a second current electrode coupled to the output node; and a third resistor having a first terminal coupled to the control electrode of the third NPN transistor and a second terminal coupled to the second current electrode of the third NPN transistor; and a first N channel transistor, a second N channel transistor, and a third N channel transistor coupled in series between the output node and a second power supply terminal, said first N channel transistor having a control electrode for receiving the first input signal, said second N channel transistor having a control electrode for receiving the second input signal, and said third N channel transistor having a control electrode for receiving the third input signal.

* * * * *

UNITED STATES PATENT AND TRADEMARK OFFICE
CERTIFICATE OF CORRECTION

PATENT NO. : 4,866,304
DATED      : September 12, 1989
INVENTOR(S) : Ruey J. Yu

It is certified that error appears in the above-identified patent and that said Letters Patent is hereby corrected as shown below:

column 8, line 50, change "th" to --the-- column 8, line 59, change "first P" to --third P--

Signed and Sealed this

Fourteenth Day of August, 1990

*Attest:*

HARRY F. MANBECK, JR.

*Attesting Officer*　　　　　　*Commissioner of Patents and Trademarks*